US011557837B2

(12) United States Patent
Liu et al.

(10) Patent No.: US 11,557,837 B2
(45) Date of Patent: Jan. 17, 2023

(54) FLAT PANEL LIQUID CRYSTAL ANTENNA AND MANUFACTURING METHOD THEREOF

(71) Applicant: TRUWIN OPTO-ELECTRONICS LIMITED, Guang Dong (CN)

(72) Inventors: Zhisheng Liu, Guangdong (CN); Xiangzhan Xu, Guangdong (CN); Zhiling Wang, Guangdong (CN); Taitian Lyu, Guangdong (CN); Zhuoqian Lu, Guangdong (CN); Lixiong Wang, Guangdong (CN); Jiqiang He, Guangdong (CN)

(73) Assignee: TRUWIN OPTO-ELECTRONICS LIMITED, Guang Dong (CN)

( * ) Notice: Subject to any disclaimer, the term of this patent is extended or adjusted under 35 U.S.C. 154(b) by 238 days.

(21) Appl. No.: 16/770,078

(22) PCT Filed: Mar. 14, 2019

(86) PCT No.: PCT/CN2019/078172
§ 371 (c)(1),
(2) Date: Jun. 5, 2020

(87) PCT Pub. No.: WO2020/181556
PCT Pub. Date: Sep. 17, 2020

(65) Prior Publication Data
US 2021/0210852 A1 Jul. 8, 2021

(30) Foreign Application Priority Data

Mar. 12, 2019 (CN) .......................... 201910185143.7

(51) Int. Cl.
H01Q 3/36 (2006.01)
H01P 1/18 (2006.01)
H01P 11/00 (2006.01)

(52) U.S. Cl.
CPC ................. *H01Q 3/36* (2013.01); *H01P 1/18* (2013.01); *H01P 11/00* (2013.01)

(58) Field of Classification Search
CPC .... H01Q 3/36; H01Q 1/38; H01P 1/18; H01P 11/00; H05K 3/064
See application file for complete search history.

(56) References Cited

U.S. PATENT DOCUMENTS

2014/0266897 A1* 9/2014 Jakoby ................... H01Q 3/44
29/601
2020/0221579 A1* 7/2020 Schmid .................. H05K 3/064

FOREIGN PATENT DOCUMENTS

CN 102541368 7/2012
CN 106932933 7/2017
(Continued)

OTHER PUBLICATIONS

"International Search Report (Form PCT/ISA/210) of PCT/CN2019/078172," dated Dec. 12, 2019, pp. 1-5.

Primary Examiner — Andrea Lindgren Baltzell
Assistant Examiner — Yonchan J Kim
(74) Attorney, Agent, or Firm — JCIP Global Inc.

(57) ABSTRACT

The present disclosure provides a manufacturing method of a flat panel liquid crystal antenna, including the following steps: providing a first substrate, wherein the two sides of the first substrate are provided with a first metal film layer and a third metal film layer respectively; simultaneously patterning the metal film layer on the two sides to obtain a patterned first metal film layer and a patterned third metal film layer; providing a second substrate, wherein one side of the second substrate is provided with a second metal film layer; patterning the second metal film layer to obtain a patterned second metal film layer; and oppositely bonding the first substrate and the second substrate to form a liquid crystal (Continued)

cell, and preparing a liquid crystal layer. The present disclosure also provides a flat panel liquid crystal antenna by using the above method.

10 Claims, 2 Drawing Sheets

(56) References Cited

FOREIGN PATENT DOCUMENTS

| | | |
|---|---|---|
| CN | 108490706 | 9/2018 |
| CN | 108963402 | 12/2018 |
| CN | 109314316 | 2/2019 |

* cited by examiner

FLAT PANEL LIQUID CRYSTAL ANTENNA AND MANUFACTURING METHOD THEREOF

CROSS-REFERENCE TO RELATED APPLICATION

This application is a 371 of international application of PCT application serial no. PCT/CN2019/078172, filed on Mar. 14, 2019, which claims the priority benefit of China application no. 201910185143.7, filed on Mar. 12, 2019. The entirety of each of the above mentioned patent applications is hereby incorporated by reference herein and made a part of this specification.

BACKGROUND

Technical Field

The present disclosure relates to the technical field of wireless communication, in particular to a flat panel liquid crystal antenna and a manufacturing method thereof.

Description of Related Art

Information network technologies are developing with each passing day, and major changes are occurring or will occur in various fields, in which hotspot technologies comprise 5G and satellite mobile Internet communication technologies.

Antenna, as the core equipment for sending and receiving communication information, has become the key factor affecting the performance index of information networks and the application effect of users.

It is known that the existing phased array antenna has this performance index, but it is based on the national defense application background and chip manufacturing technology, and its expensive production cost and high power consumption make it unaffordable for consumers in the consumer market, thus causing obstacles to the popularization of consumer products.

The traditional mechanical rotating paraboloid antenna has the problems of being large in size, bulky, prone to damage due to mechanical rotation and high in cost, thus being unable to meet the requirements of new applications such as vehicle-mounted/air-borne applications. At present, there is an urgent demand in the market for small-size, low-profile, electrically-controlled and low-cost flat panel antenna.

SUMMARY

In order to solve the above problems, a solution for a low-cost flat panel liquid crystal antenna suitable for large-scale manufacturing is provided.

The present disclosure provides a manufacturing method of a flat panel liquid crystal antenna, the manufacturing method including the following steps:

providing a first substrate with metal film layers on two sides, wherein the two sides of the first substrate are provided with a planar first metal film layer and a planar third metal film layer respectively;

simultaneously patterning the metal on the two sides of the first substrate, wherein the planar first metal film layer and the planar third metal film layer are patterned simultaneously to obtain a patterned first metal film layer and a patterned third metal film layer;

providing a second substrate, wherein one side of the second substrate is provided with a planar second metal film layer;

patterning the planar second metal film layer to obtain a patterned second metal film layer; and oppositely bonding the first substrate and the second substrate to form a liquid crystal cell, and preparing a liquid crystal layer.

Preferably, the step of simultaneously patterning the metal on the two sides of the first substrate includes the following steps:

photoresist coating: coating the metal film layers on a first surface and a second surface of the first substrate with photoresist;

exposure: selectively exposing the photoresist on the first surface and the second surface of the first substrate by using a pre-prepared electrode pattern mask plate;

developing: simultaneously developing the photoresist on the first surface and the second surface of the first substrate, so that the exposed photoresist is chemically dissolved in a developing solution and the unexposed photoresist is retained;

etching: simultaneously etching the metal film layers on the first surface and the second surface of the first substrate, so as to etch away the parts, not covered by the photoresist, of the metal film layers by using etching liquid to obtain a pattern of the first metal film layer and a pattern of the third metal film layer.

Preferably, after etching, the step of simultaneously patterning the metal on the two sides of the first substrate further includes the following step:

stripping: rinsing off the remaining photoresist on the first surface and the second surface of the first substrate to obtain the patterned first metal film layer and the patterned third metal film layer.

Preferably, the photoresist coating is to coat the metal film layers on the first surface and the second surface of the first substrate with the photoresist.

Preferably, the exposure is to selectively expose the photoresist on the first surface and the second surface of the first substrate simultaneously.

Preferably, the exposure is to selectively expose the photoresist on the first surface and the second surface of the first substrate respectively.

Preferably, the manufacturing method of the flat panel liquid crystal antenna further includes:

preparing a first alignment layer on the patterned first metal film layer and a second alignment layer on the patterned second metal film layer.

The present disclosure also provides a flat panel liquid crystal antenna, and the flat panel liquid crystal antenna includes a first substrate and a second substrate which are oppositely arranged and a liquid crystal layer positioned between the first substrate and the second substrate;

a patterned first metal film layer is arranged on a first surface, facing the second substrate, of the first substrate; a patterned third metal film layer is arranged on a second surface, facing away from the second substrate, of the first substrate; a patterned second metal film layer is arranged on the side, facing the first substrate, of the second substrate; and the flat panel liquid crystal antenna is manufactured by the manufacturing method described above.

Preferably, the patterned first metal film layer includes a first electrode, the patterned third metal film layer includes an antenna radiation unit, and the patterned second metal film layer includes a second electrode.

Preferably, the first metal film layer and the third metal film layer are made of the same material.

Preferably, the first substrate is a glass substrate, the material of the first metal film layer and the third metal film layer is copper, and the thickness of the first metal film layer is not less than 2.0 μm.

Preferably, the ratio of the thickness of the first metal film layer to the thickness of the third metal film layer is between 0.8 and 1.2.

Compared with the prior art, the present disclosure has the following beneficial effects:

Through structural improvement, simultaneous patterning of the metal on the two sides is made possible, most low-efficiency yellow-light procedures are omitted, and time for busy waiting, model switching, etc. is saved. The flat panel liquid crystal antenna can be manufactured on a large scale, the manufacturing efficiency is improved, and the manufacturing cost is reduced.

DESCRIPTION OF REFERENCE NUMERALS

11— first substrate, 12— second substrate, 21— first metal film layer, 22— second metal film layer, 23— third metal film layer, 30— liquid crystal layer, 40— sealant.

DESCRIPTION OF THE EMBODIMENTS

In order to make the object, technical solution and advantages of the present disclosure clearer, the present disclosure will be described in further detail below in conjunction with the accompanying drawings. Obviously, the described embodiments are only a part of the embodiments of the present disclosure, not all of the embodiments. Based on the embodiments of the present disclosure, all other embodiments obtained by those skilled in the art without creative labor are within the scope of the present disclosure.

A flat panel liquid crystal antenna and a manufacturing method thereof according to the present disclosure will be further described below in conjunction with the drawings and embodiments.

Embodiment 1

Figure 1:
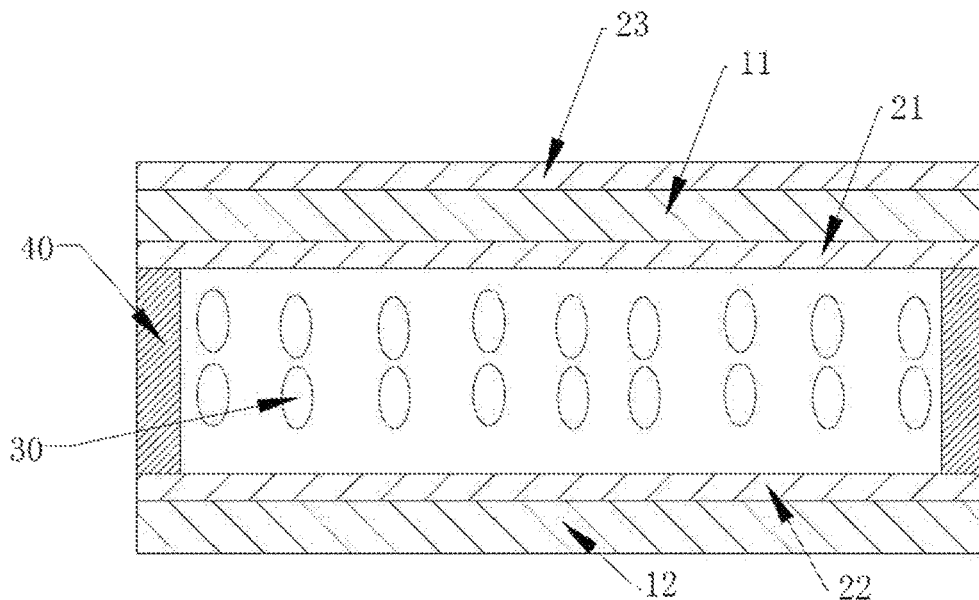
FIG. 1 is a structural schematic diagram of a flat panel liquid crystal antenna provided in Embodiment 1 of the present disclosure.
Figure 2:
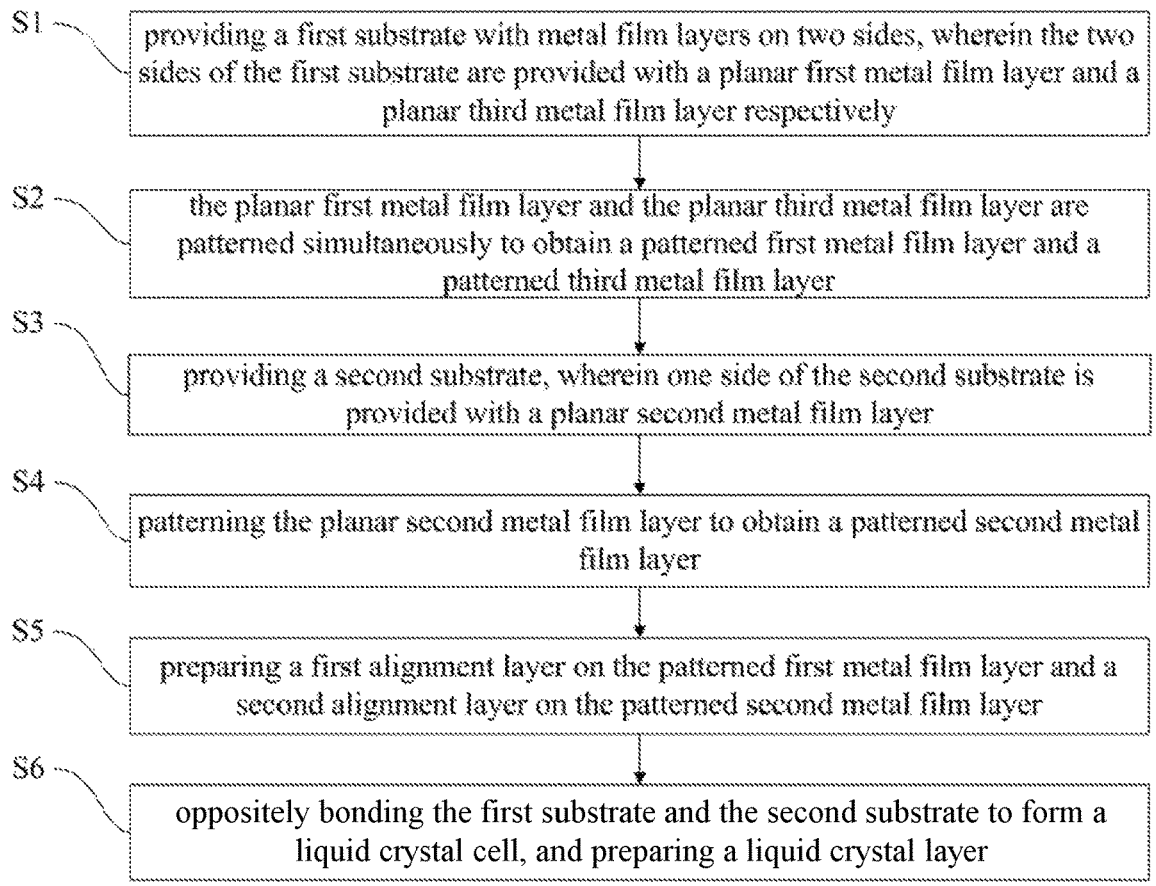
FIG. 2 is a flowchart of a manufacturing method of a flat panel liquid crystal antenna provided in Embodiment 2 of the present disclosure.
Figure 3:
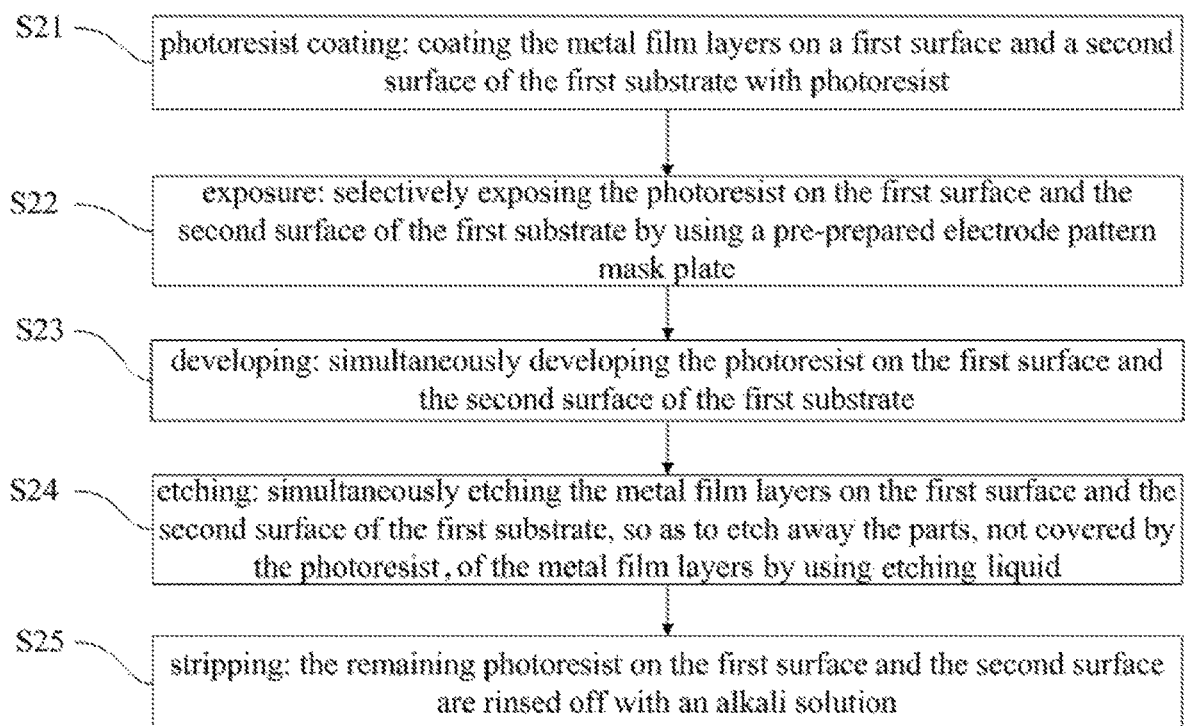
FIG. 3 is a flowchart of a step of simultaneously patterning the metal on the two sides of a first substrate according to Embodiment 2 of the present disclosure.

FIG. 1 shows Embodiment 1 of the present disclosure, which provides a flat panel liquid crystal antenna. The flat panel liquid crystal antenna includes a first substrate 11 and a second substrate 12 which are oppositely arranged, and further includes a liquid crystal layer 30 positioned between the first substrate 11 and the second substrate 12.

The first substrate 11 and the second substrate 12 are made of materials with good stability and insulation effect and extremely low dielectric loss. In the present embodiment, the first substrate 11 and the second substrate 12 are rigid substrates, which may be made of a glass material, molten quartz, a ceramic material or a ceramic thermosetting polymer composite.

A first metal film layer 21 is arranged on a first surface, facing the second substrate 12, of the first substrate 11. The first metal film layer 21 is a patterned first metal film layer. The patterned first metal film layer 21 includes a first electrode.

A patterned third metal film layer 23 is arranged on a second surface, facing away from the second substrate 12, of the first substrate 11. Specifically, the third metal film layer 23 is a patterned third metal film layer.

The third metal film layer 23 includes an antenna radiation unit. The antenna radiation unit is used for radiating microwave signals to realize the feed-in and feed-out of microwave signals.

A patterned second metal film layer 22 is arranged on the side, facing the first substrate 11, of the second substrate 12, and specifically, the second metal film layer 22 is a patterned second metal film layer. The second metal film layer 22 includes a second electrode.

A metal pattern of each patterned metal film layer is obtained by first fabricating a metal film layer on the corresponding substrate and then patterning the metal film layer.

The fabrication of the metal film layer on the corresponding substrate can be achieved by film coating, that is, coating the substrate with a metal film and forming a planar metal film layer on a surface of the substrate. After film coating, the entire surface of the substrate is coated with the metal film layer which has a structure similar to a plane, so it is referred to herein as a planar metal film layer.

The patterning process generally includes etching. During etching, the parts, not covered by photoresist, of the metal are etched away by using etching liquid to obtain a metal electrode pattern.

Preferably, the patterned first metal film layer and the patterned third metal film layer are obtained by synchronously patterning the first metal film layer and the third metal film layer of the first substrate.

If one of the first metal film layer 21 and the third metal film layer 23 is etched first and then the other is etched according to the conventional process, an etched metal pattern may be destroyed in the subsequent etching process. If the protection for the etched metal pattern is added in the subsequent etching process, an obvious decrease in efficiency may be caused.

Through structural improvement, simultaneous patterning of the metal on the two sides is made possible, and patterns on the two sides can be produced at one time, so that the flat panel liquid crystal antenna can be manufactured on a large scale, the manufacturing efficiency is improved, and the manufacturing cost is reduced. Most low-efficiency yellow-light procedures are omitted, and time for busy waiting, model switching, etc. is saved.

In the prior art, the materials of the first metal film layer 21 and the third metal film layer 23 may be different, but in the present embodiment, the first metal film layer 21 and the third metal film layer 23 are made of the same material.

When the metal film layer is patterned, the parts, not covered by the photoresist, of the metal film layer need to be etched away in the etching process. In the specific etching process, the etching liquid and the specific parameters of the etching process are generally set according to the metal material and the thickness of the metal film layer.

If the materials of the first metal film layer 21 and the third metal film layer 23 are different, different kinds of etching liquid and different parameters of the etching process are adopted, making simultaneous etching hard to realize.

By allowing the first metal film layer 21 and the third metal film layer 23 to be made of the same material, the planar first metal film layer 21 and the planar third metal film layer 23 can be simultaneously patterned later. More specifically, it is conducive to simultaneous etching in the later process.

In addition, it is preferable that the thickness of the first metal film layer 21 and the thickness of the third metal film layer 23 are approximately equal. Specifically, the ratio of the thickness of the first metal film layer 21 to the thickness of the third metal film layer 23 is between 0.8 and 1.2. More preferably, the thickness of the first metal film layer 21 and the thickness of the third metal film layer 23 are the same. The patterning process generally includes etching. During etching, the parts, not covered by the photoresist, of the metal need to be etched away by using etching liquid to obtain a metal electrode pattern. By making the thickness of the first metal film layer 21 approximately equal to the thickness of the third metal film layer 23, the process of simultaneously patterning the planar first metal film layer 21 and the planar third metal film layer 23 can be made simpler, and the situation that one of the first metal film layer 21 and the third metal film layer 23 is overetched or insufficiently etched is avoided.

The first substrate 11 is preferably a glass substrate.

Since the metal material required by the flat panel liquid crystal antenna requires high conductivity and magnetic permeability, the first metal film layer 21 and the second metal film layer 22 are made of a metal material with high conductivity and magnetic permeability, such as aluminum, copper, silver, gold, cadmium, chromium, molybdenum, niobium, nickel and iron, preferably silver, copper, gold, aluminum and alloys thereof.

Since the first metal film layer 21 and the third metal film layer 23 are preferably made of the same material, the metal material of the third metal film layer 23 is silver, copper, gold, aluminum, or alloys thereof.

Among the metal materials silver, copper, gold, aluminum and alloys thereof, silver has the best conductivity but is expensive, and is generally suitable for vacuum magnetron sputtering process. Gold is more expensive and is not suitable for etching patterns and traces by subtraction. Aluminum is generally more suitable for vacuum magnetron sputtering process. Therefore, the material of the first metal film layer 21 and the third metal film layer 23 is copper. It should be understood that the material of the second metal film layer 22 is also preferably copper.

The lower the loss of wireless communication is, the better its performance is, that is, the lower the insertion loss (including conductor loss) is, the better its performance is. It is known that metal material and the thicknesses of the metal film layers are related to conductor loss, which can be embodied by the skin effect.

Due to the skin effect of alternating current, the skin effect indirectly increases the resistance of a conductor, and its energy heat loss also increases. In high-frequency bands such as microwave, the skin effect is very obvious. Different metal materials have different skin depths.

Skin effect: when there is alternating current or alternating electromagnetic field in the conductor, the current distribution inside the conductor is not uniform, and the current is concentrated on the outer skin part of the conductor; and the closer to the surface of the conductor is, the greater the current density is, and the actual current inside the conductor is very small. As a result, the resistance of the conductor increases and its loss power also increases. This phenomenon is called skin effect.

Skin depth δ is given by the following formula:

$$\delta = (1/\pi f \mu \sigma)^{1/2},$$

wherein μ represents the magnetic permeability of the metal material, σ represents the conductivity of the conductor, and f represents the frequency of a signal carried by the flat panel liquid crystal antenna.

Since the metal material of the first metal film layer 21 is preferably a copper material, according to the skin effect, the thickness of the metal film layer is of the μm grade, which can well ensure the performance of the flat panel liquid crystal antenna. Preferably, the thickness of the metal film layer is not less than 2.0 μm. Therefore, the thickness of the first metal film layer 21 is not less than 2.0 μm.

There is also sealant 40 between the first substrate 11 and the second substrate 12. The sealant 40 is located at the edges of the first substrate 11 and the second substrate 12 and is used for sealing the liquid crystal layer 30. Preferably, a support material is distributed in the liquid crystal layer 30.

The flat panel liquid crystal antenna further includes a first alignment layer and a second alignment layer disposed on the two sides of the liquid crystal layer 30 respectively.

The first alignment layer is prepared on the patterned first metal film layer 21 of the first substrate 11, and the second alignment layer is prepared on the patterned second metal film layer 22 of the second substrate 12. The alignment layers are used to define the initial deflection angle of liquid crystal molecules of the liquid crystal layer 30.

The first substrate 11, the second substrate 12, the liquid crystal layer 30, a first conductive layer, and a second conductive layer constitute a liquid crystal phase shifter.

The antenna radiation unit is disposed on the side, away from the second substrate 12, of the first substrate 11. The antenna radiation unit may be rectangular, circular, or square. In an existing flat panel liquid crystal antenna, the antenna radiation unit attaches a patch to the liquid crystal phase shifter through a patch attaching process. In the present embodiment, it is more preferable that the antenna radiation unit is obtained by patterning the third metal film layer 23 disposed on the side, away from the second substrate 12, of the first substrate 11.

In the present embodiment, a microstrip line is arranged on the second electrode. The shape of the microstrip line may be serpentine or spiral, which is not limited, as along as the transmission of the microwave signals can be realized.

The first electrode is a grounding electrode. By applying a voltage between the microstrip line and the grounding electrode, the dielectric constant of liquid crystal can be changed.

When no electric field is applied between the microstrip line and the grounding electrode, the liquid crystal molecules are arranged in a preset direction under the action of the first alignment layer and the second alignment layer.

When an electric field is applied between the microstrip line and the grounding electrode, the electric field drives deflection of the liquid crystal molecules in the liquid crystal layer 30.

The microwave signals are transmitted between the microstrip line and the grounding electrode. During the transmission of the microwave signals, the phase will be changed due to the deflection of the liquid crystal molecules, thus realizing the phase shift function of the microwave signals. By controlling the voltage on the microstrip line and the grounding electrode, the deflection angle of liquid crystals in the liquid crystal layer 30 can be controlled, and further the phase adjusted in the phase shifting process can be controlled.

Compared with the prior art, the present disclosure has the following beneficial effects:

Through structural improvement, simultaneous patterning of the metal on the two sides is made possible, and patterns on the two sides can be produced at one time, so that the flat panel liquid crystal antenna can be manufactured on a large scale, the manufacturing efficiency is improved, and the manufacturing cost is reduced. Most low-efficiency yellow-light procedures are omitted, and time for busy waiting, model switching, etc. is saved.

Further, the patterning process is made simpler, and the situation that one of the first metal film layer and the third metal film layer is overetched or insufficiently etched is avoided.

Embodiment 2

The specific embodiment provides a manufacturing method of a flat panel liquid crystal antenna. The manufacturing method is used for manufacturing the flat panel liquid crystal antenna described in the Embodiment 1. The manufacturing method includes the following steps:

Step S1: providing a first substrate 11 with metal film layers on two sides, wherein the two sides of the first substrate 11 are provided with a planar first metal film layer 21 and a planar third metal film layer 23 respectively;

Step S2: simultaneously patterning the metal on the two sides, wherein the planar first metal film layer 21 and the planar third metal film layer 23 are patterned simultaneously to obtain a patterned first metal film layer 21 and a patterned third metal film layer 23;

Step S3: providing a second substrate 12, wherein one side of the second substrate 12 is provided with a planar second metal film layer 22; and Step S4: patterning the planar second metal film layer 22 to obtain a patterned second metal film layer 22.

It should be noted that the sequence of step S2 and step S4 may be adjusted.

The step of simultaneously patterning the metal on the two sides in step S2 includes the following steps:

Step S21: photoresist coating: coating the metal film layers on a first surface and a second surface of the first substrate 11 with photoresist;

Step S22: exposure: selectively exposing the photoresist on the first surface and the second surface of the first substrate 11 by using a pre-prepared electrode pattern mask plate;

Step S23: developing: simultaneously developing the photoresist on the first surface and the second surface of the first substrate 11, so that the exposed photoresist is chemically dissolved in a developing solution and the unexposed photoresist is retained; and Step S24: etching: simultaneously etching the metal film layers on the first surface and the second surface of the first substrate 11, so as to etch away the parts, not covered by the photoresist, of the metal film layers by using etching liquid to obtain a pattern of the first metal film layer 21 and a pattern of the third metal film layer 23.

If one of the first metal film layer 21 and the third metal film layer 23 is etched first and then the other is etched according to the conventional process, an etched metal pattern may be destroyed in the subsequent etching process. If the protection for the etched metal pattern is added in the subsequent etching process, an obvious decrease in efficiency may be caused.

In the prior art, the materials of the first metal film layer 21 and the third metal film layer 23 may be different, but in the present embodiment, the materials of the first metal film layer 21 and the third metal film layer 23 are the same, preferably copper. The thickness of the first metal film layer 21 and the thickness of the third metal film layer 23 are approximately equal.

When step S2 of patterning the metal film layer is performed, the parts, not covered by the photoresist, of the metal film layer need to be etched away in the etching process. In the specific etching process, the specific parameters of the etching process are generally set according to the metal material and the thickness of the metal film layer.

If the materials of the first metal film layer 21 and the third metal film layer 23 are different or the materials are the same but the thicknesses of the film layers differ greatly when the first metal film layer 21 and the third metal film layer 23 are etched simultaneously, the result is the etching of one of the first metal film layer 21 and the third metal film layer 23 is finished before the other.

In the present embodiment, the first metal film layer 21 and the third metal film layer 23 are made of the same material and have approximately equal thickness, which is advantageous for simultaneous patterning of the planar first metal film layer 21 and the planar third metal film layer 23 later, and more specifically, advantageous for simultaneous etching later.

By saying that the thicknesses are approximately equal, it means that the ratio of the thickness of the first metal film layer 21 to the thickness of the third metal film layer 23 is between 0.8 and 1.2. More preferably, the thickness of the first metal film layer 21 and the thickness of the third metal film layer 23 are the same.

By simultaneously etching the planar first metal film layer 21 and the planar third metal film layer 23, the patterning process is simpler, and the situation that one of the first metal film layer 21 and the third metal film layer 23 is overetched or insufficiently etched is avoided.

In the above photoresist coating process, the entire surface of the metal film layer on the first surface or the metal film layer on the second surface may be coated with the photoresist. The photoresist is an exposure medium for etching patterns in subsequent processes. After being coated with the photoresist, one metal film layer is pre-cured. Then the entire surface of the other metal film layer is coated with the photoresist, and then pre-cured. Pre-curing generally involves baking the substrate coated with the photoresist to volatilize a solvent of the photoresist and increase the adhesion between the photoresist and the substrate surface.

In the above exposure step, the photoresist on the first surface and the second surface of the first substrate 11 may be exposed simultaneously, or the photoresist on the first surface and the second surface of the first substrate 11 may be exposed in sequence. The photoresist is exposed by using the mask plate, so as to form a photoresist non-retained area and a photoresist retained area. For example, the photoresist retained area on the first metal film layer 21 corresponds to the area where a pattern of the first electrode is located, and the photoresist non-retained area corresponds to the area other than the pattern. During specific exposure, ultraviolet light (UV) is irradiated on the surface of the photoresist through the pre-prepared electrode pattern mask plate, so that the photoresist in the photoresist non-retained area reacts to realize selective exposure.

In the above developing step, only the photoresist exposed to UV is dissolved in the developing solution, while the unexposed photoresist layer is not dissolved in the developing solution, leaving the required photoresist pattern.

The developed substrate is subjected to high-temperature hard-baking to make the photoresist firmer.

In the above etching step, the parts, not covered by the photoresist, of the metal film layer are etched away, and the parts, covered by the photoresist, of the metal film layer are protected by the photoresist to form a metal pattern structure. A pattern of the first electrode is formed on the first metal film layer 21, and a pattern of the antenna radiation unit is formed on the third metal film layer 23.

After etching, step S2 of simultaneously patterning the metal on the two sides further includes the following step:

Step S25: stripping: as the etched metal film layer is still covered with the photoresist on the metal pattern, by stripping, the remaining photoresist on the first surface and the second surface are rinsed off with an alkali solution, so as to obtain the patterned first metal film layer 21 and the patterned third metal film layer 23.

The first surface and the second surface of the first substrate 11 may be stripped one by one. Alternatively, the first surface and the second surface of the first substrate 11 may be simultaneously stripped.

The specific step of patterning the second metal film layer 22 can be performed with reference to the above process step of patterning the first metal film layer 21.

The manufacturing method of the flat panel liquid crystal antenna also includes the following steps:

Step S5: preparing a first alignment layer on the patterned first metal film layer 21 and a second alignment layer on the patterned second metal film layer 22; and Step S6: oppositely bonding the first substrate 11 and the second substrate 12 to form a liquid crystal cell, and preparing a liquid crystal layer 30.

The alignment layers may be made by PI friction process in the prior art so as to form orientation grooves on the surfaces, which will not be detailed here.

Specifically, in one embodiment, the first substrate 11 and the second substrate 12 may be first aligned and assembled to form the liquid crystal cell, which is then filled with the liquid crystal layer 30. It is known that before the first substrate 11 and the second substrate 12 are aligned and assembled, sealant 40 is also prepared on one of the substrates, and the sealant 40 defines an accommodation space between the first substrate 11 and the second substrate 12 for accommodating liquid crystals. After the liquid crystal cell is filled with the liquid crystal layer 30, the liquid crystal cell is sealed and the sealant 40 is cured.

In other embodiments, the order of oppositely bonding to form the liquid crystal cell and preparing the liquid crystal layer 30 is not limited to the above, but may also be: after coating one of the substrates with the sealant 40, dripping liquid crystals onto the substrate to form the liquid crystal layer 30, oppositely bonding the first substrate 11 and the second substrate 12 to form the liquid crystal cell, and then curing the sealant 40.

Compared with the prior art, the present disclosure has the following beneficial effects:

Through simultaneous patterning of the metal on the two sides of the first substrate, patterns on two sides can be produced at one time, most low-efficiency yellow-light procedures are omitted, and time for busy waiting, model switching, etc. is saved. The flat panel liquid crystal antenna can be manufactured on a large scale, the manufacturing efficiency is improved, and the manufacturing cost is reduced.

The present disclosure avoids the situation occurring in the traditional process that as the first metal film layer and the third metal film layer are etched one by one, an etched metal pattern may be destroyed in the subsequent etching process, and in order to avoid damaging the etched metal pattern, a significant decrease in efficiency may be caused.

Finally, it should be noted that the above embodiments are only used to illustrate the technical solutions of the embodiments of the present disclosure and not to limit them. Although the embodiments of the present disclosure have been described in detail with reference to the preferred embodiments, those of ordinary skill in the art should understand that the technical solutions of the embodiments of the present disclosure can still be modified or substituted equivalently, and these modifications or equivalent substitutions cannot make the modified technical solutions depart from the scope of the technical solutions of the embodiments of the present disclosure.

The invention claimed is:

1. A manufacturing method of a flat panel liquid crystal antenna, wherein the manufacturing method including following steps:
   providing a first substrate with metal film layers on two sides, wherein the two sides of the first substrate are provided with a planar first metal film layer and a planar third metal film layer respectively;
   simultaneously patterning the metal film layers on the two sides of the first substrate, wherein the planar first metal film layer and the planar third metal film layer are patterned simultaneously to obtain a patterned first metal film layer and a patterned third metal film layer, and the patterned third metal film layer includes an antenna radiation unit;
   providing a second substrate, wherein one side of the second substrate is provided with a planar second metal film layer;
   patterning the planar second metal film layer to obtain a patterned second metal film layer; and
   oppositely bonding the first substrate and the second substrate to form a liquid crystal cell, and preparing a liquid crystal layer,
   wherein a material of the planar first metal film layer and a material of the planar third metal film layer are the same,
   wherein a ratio of a thickness of the planar first metal film layer to a thickness of the planar third metal film layer is between 0.8 and 1.2.

2. The manufacturing method of the flat panel liquid crystal antenna according to claim 1, wherein the step of simultaneously patterning the metal film layers on the two sides of the first substrate includes following steps:
   photoresist coating: coating the metal film layers on a first surface and a second surface of the first substrate with photoresist;
   exposure: selectively exposing the photoresist on the first surface and the second surface of the first substrate by using a pre-prepared electrode pattern mask plate;
   developing: simultaneously developing the photoresist on the first surface and the second surface of the first substrate, so that exposed photoresist is chemically dissolved in a developing solution and unexposed photoresist is retained; and
   etching: simultaneously etching the metal film layers on the first surface and the second surface of the first substrate, so as to etch away parts, not covered by the photoresist, of the metal film layers by using etching liquid to obtain a pattern of the first metal film layer and a pattern of the third metal film layer.

3. The manufacturing method of the flat panel liquid crystal antenna according to claim 2, wherein, after the etching, the step of simultaneously patterning the metal film layers on the two sides of the first substrate further includes a following step:
   stripping: rinsing off remaining photoresist on the first surface and the second surface of the first substrate to obtain the patterned first metal film layer and the patterned third metal film layer.

4. The manufacturing method of the flat panel liquid crystal antenna according to claim 2, wherein the photoresist coating is to coat the metal film layers on the first surface and the second surface of the first substrate with the photoresist.

5. The manufacturing method of the flat panel liquid crystal antenna according to claim 2, wherein the exposure is to selectively expose the photoresist on the first surface and the second surface of the first substrate simultaneously.

6. The manufacturing method of the flat panel liquid crystal antenna according to claim 2, wherein the exposure is to selectively expose the photoresist on the first surface and the second surface of the first substrate respectively.

7. The manufacturing method of the flat panel liquid crystal antenna according to claim 1, wherein the manufacturing method of the flat panel liquid crystal antenna further includes:
   preparing a first alignment layer on the patterned first metal film layer and a second alignment layer on the patterned second metal film layer.

8. A flat panel liquid crystal antenna, and the flat panel liquid crystal antenna includes a first substrate and a second substrate which are oppositely arranged and a liquid crystal layer positioned between the first substrate and the second substrate; wherein
   a patterned first metal film layer is arranged on a first surface, facing the second substrate, of the first substrate; a patterned third metal film layer is arranged on a second surface, facing away from the second substrate, of the first substrate; a patterned second metal film layer is arranged on a side, facing the first substrate, of the second substrate; and
   the flat panel liquid crystal antenna is manufactured by the manufacturing method of the flat panel liquid crystal antenna as claimed in claim 1.

9. The flat panel liquid crystal antenna according to claim 8, wherein the patterned first metal film layer includes a first electrode, and the patterned second metal film layer includes a second electrode.

10. The flat panel liquid crystal antenna according to claim 8, characterized in that the first substrate is a glass substrate, a material of the patterned first metal film layer and the patterned third metal film layer is copper, and a thickness of the patterned first metal film layer is not less than 2.0 μm.

* * * * *